Jan. 20, 1970 Z. SHABAD 3,491,203

TEMPERATURE STABILIZED AMPLIFIER

Filed Oct. 18, 1966 2 Sheets-Sheet 1

INVENTOR.
ZYGMUND SHABAD

BY

OSTROLENK, FABER, GERB & SOFFEN
ATTORNEYS

Jan. 20, 1970 Z. SHABAD 3,491,203

TEMPERATURE STABILIZED AMPLIFIER

Filed Oct. 18, 1966

2 Sheets-Sheet 2

United States Patent Office 3,491,203

Patented Jan. 20, 1970

3,491,203

TEMPERATURE STABILIZED AMPLIFIER

Zygmund Shabad, Bronx, N.Y., assignor to Sonotone Corporation, Elmsford, N.Y., a corporation of New York Filed Oct. 18, 1966, Ser. No. 587,472
Int. Cl. H04m *1/00*; H04r *25/00*
U.S. Cl. 179—1 9 Claims

ABSTRACT OF THE DISCLOSURE

A multistage direct current coupled amplifier particularly suited for hearing aid use including a power supply decoupling network having a negative temperature coefficient resistance operative to provide temperature stabilization and gain adjustment, as well as providing decoupling of feedback signals to individual ones of the amplifier stages.

My invention relates to an improved circuit arrangement for achieving temperature stabilization in a multistage amplifier circuit, and more particularly to an extremely simple and compact arrangement wherein a component of the power supply decoupling network serves to temperature stabilize the amplifier gain and operating current over a wide range of output loads.

My invention has particular utility in conjunction with hearing aids, wherein the desire for compactness and reliability requires an amplifier circuit having a minimum of components, and which will provide high quality audio reproduction over a wide range of ambient operating temperatures.

Hearing aids typically include a microphone for receiving the audio frequencies to be amplified, an amplifier circuit electrically connected to the microphone, an earphone at the amplifier output, and a means for directing the earphone output to the user's ear. The state of the hearing aid art has progressed to a point wherein the entire instrument may be located within a housing of small enough size to be inserted within the ear of the user, placed behind the user's ear, or mounted in an eyeglass frame.

The amplifier circuitry of such hearing aid instruments typically include a plurality of transistor elements, directly coupled to provide a multistage amplifier providing the required gain. As is well known, the characteristics of a transistor are temperature dependent. Hence, such amplifiers generally tend to experience a variation in gain and operating current with accompanying temperature variations. Accordingly, circuitry should be provided to compensate against these variations within the anticipated ambient operating range, e.g. 20° F. to 120° F.

In the past, various techniques have been proposed for stabilizing such multistage direct coupled transistor amplifiers against temperature induced gain and operating current variations. One such arrangement utilizes a temperature sensitive impedance element in the overall negative feedback path between the last and first stages of the amplifier. This arrangement requires a positive temperature coefficient element having a resistance of about 300 thousands ohms to 1 megohm. A positive temperature coefficient element having such resistance value and the required percentage change of resistance with temperature is unavailable in the present state-of-the-art.

Other arrangements are also known of inserting additional temperature compensating elements at various locations of the circuitry in the attempt to achieve the required stabilization. These arrangements generally require the use of at least one additional component, necessitating a significant increase in the size of the amplifier. In the case of an integrated circuit module, most of the junctions in the circuit are inaccessible for inserting such required stabilizing elements. In such case, only stabilizing circuits that can make use of accessible terminals can even be considered.

My invention solves these problems in an extremely simple and inexpensive manner by modifying the battery decoupling circuit of the multistage amplifier in a manner such that this circuit, in addition to decoupling feedback signals due to the internal impedance of the battery, counteracts the temperature induced variations of gain and current. More specifically, I utilize a negative temperature coefficient resistance element in the decoupling circuit. The decoupling circuit consists solely of this element and a bypass capacitor. The characteristics of the negative temperature coefficient resistance element are correlated to the overall amplifier characteristics, so as to stabilize the tendency of the amplifier gain and current to vary with temperature. I have found that effective stabilization over an operating range in the order of 20° to 120° F. can be obtained in this manner with a resistive element of a small size. The stabilization of operating current is an important factor in obtaining satisfactory life of the small battery cells utilized in miniaturized hearing aids.

The present state of the electronic art permits the direct coupled transistors and their loads to be formed as a self-contained semiconductor integrated circuit. Such integrated amplifiers may even be temperature stabilized for a particular load impedance and particular value of output current. Any required substantial departure from these conditions results in loss of stabilization. The instant invention allows the choice of any of a wide range of output load impedances and operating currents with complete stabilization of gain and operating current. Advantageously, the negative temperature coefficient resistance element may be directly coupled to two of the normally available external terminals of the integrated circuit. Hence, integrated circuitry techniques may be used with only a minimum of additional circuitry being required for the functions of gain control, temperature stabilization, and battery decoupling.

Various other advantages have also been obtained with my novel circuit arrangement. For example, by proper selection of the nominal value for the negative temperature coefficient resistance element, I am able to adjust the basic gain of the overall amplifier circuit. Thus, proper selection of the element serves three basic functions: (1) Stabilization of current and gain with temperature changes; (2) decoupling of feedback signals from the battery to the amplifier stages; and (3) gain adjustment.

It is, therefore, a primary object of my instant invention to provide a multistage amplifier circuit having a temperature stabilization arrangement of extreme simplicity and compactness.

A further object of my invention is to provide a multistage amplifier circuit in which the battery decoupling circuit includes a negative temperature coefficient resistance element to provide temperature stabilization over a desired operating range.

Another object of my invention is to provide a multistage transistorized amplifier circuit, of particular utility for a hearing aid, in which the temperature induced variations of gain and current, resulting from the temperature dependent transistor characteristics, are compensated for by a negative temperature coefficient resistance element within the battery decoupling circuit.

An additional object of my invention is to provide a multistage amplifier circuit in which the battery decoupling portion thereof consists solely of a negative temperature coefficient element and a capacitor, with said negative temperature coefficient element serving the additional functions of circuit temperature stabilization and gain adjustment.

It is yet a further object of this invention to provide a temperature stabilized, direct coupled multistage integrated circuit amplifier of extreme compactness and simplicity, which can conveniently be adapted to permit a choice of output loads and currents.

The above-mentioned and other objects and features of my invention will become apparent by reference to the following description taken in conjunction with the accompanying figures in which.

Figure 1:
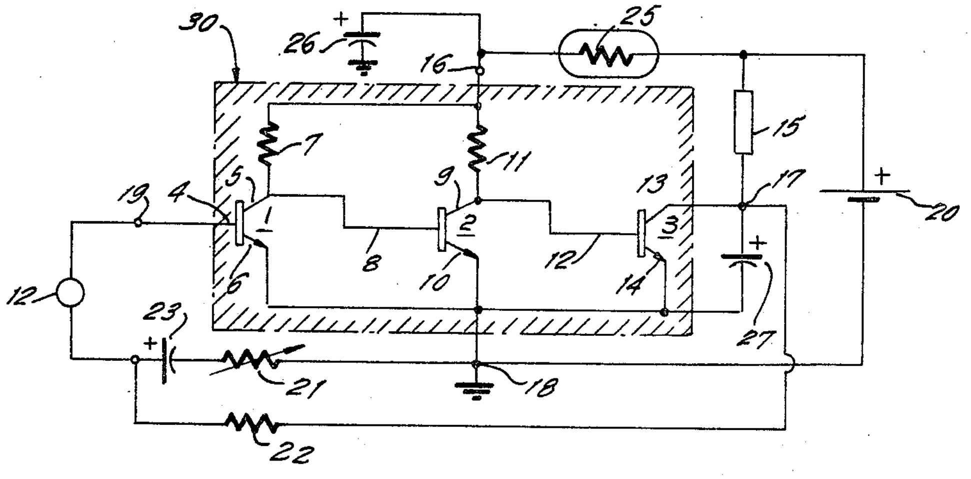
FIGURE 1 illustrates a schematic diagram of a preferred embodiment of a multistage temperature stabilized hearing aid amplifier according to my invention.

Referring to the figures, the hearing aid device 50, which is typically shown in a size and configuration for insertion within the user's ear, includes the electrical components schematically shown in FIGURE 1. This circuit includes a multistage amplifier, having an integrated circuit portion designated as 30 and shown shaded in FIGURE 1. The integrated circuit includes direct coupled NPN transistors 1, 2 and 3.

It should be understood that PNP transistors could also be used by making the appropriate complementary bias connections. The input to the amplifier is typically a microphone 12, one end thereof being coupled via terminal 19 to the base 4 of transistor 1. Coupled to the collector 5 of transistor 1 is a load resistor 7. The emitter terminals 6, 10 and 14 of transistors 1, 2 and 3, respectively, are coupled directly to ground potential at terminal 18. The collector 5 of transistor 1 is coupled directly to the base 8 of transistor 2. The collector 9 of transistor 2 is coupled to load resistor 11, the other ends of load resistors 7 and 11 being coupled together to form common junction point 16. The collector 9 of transistor 2 is also directly coupled to the base 12 of transistor 3. The collector 13 of transistor 3 is coupled to the output device 15, typically an earphone, and to capacitor 27 at junction point 17. The other end of capacitor 27 is coupled to ground.

The other end of microphone 12 is coupled to one end of the series combination of a capacitor 23 and a variable resistance 21, the other end of said series combination being coupled to ground. Variable resistance 21 is the volume control for the hearing aid amplifier circuit. In order to provide a bias for the transistors, resistor 22 is coupled between junction point 17 and the other end of microphone 12. Transistor bias is obtained by unidirectional source battery 20. The negative terminal of the battery is coupled to ground and its positive terminal coupled to the opposite end of load device 15, thereby supplying D.C. voltage to the third stage.

Also coupled to the positive terminal of battery 20 is a negative temperature coefficient resistor 25, hereinafter referred to as a thermistor. The other end of thermistor 25 is coupled to common junction point 16, thereby supplying D.C. voltage to the first and second stages (transistors 1 and 2) of the amplifier. Thermistor 25 and capacitor 26 form a decoupling circuit for preventing any feedback developed due to output signal current flowing through the battery impedance. The decoupling circuit prevents any of these signals from being fed back to the low level pre-amplifier stages.

In accordance with my invention, thermistor 25 also serves to stabilize the amplifier against variation in gain and current resulting from the temperature dependent characteristics of the transistors.

A brief description of the effects of an increase in temperature on an unstabilized, direct coupled amplifier in the absence of signals is given below. For the purposes of this explanation, assume that thermistor 25 in the figure is replaced by a fixed resistor. Then, as the environmental temperature increases the collector current flowing in transistor 1 will, as is well known, undergo an increase. This increase in collector current causes the voltage drop across load resistor 7 to increase, which reduces the bias voltage applied between the base 8 and emitter 10 of transistor 2. This reduction in base bias on transistor 2 causes the current flowing in the collector circuit thereof to correspondingly decrease, thereby decreasing the voltage drop across load resistor 11 and increasing the base-emitter bias voltage on transistor 3. This, in turn, causes the output current flowing through output earphone 15 to increase. It is pointed out that some temperature stabilization is provided by the D.C. feedback path through resistor 22, but because of the typically high value of this resistor, which is dictated by the circuit arrangement, this effect is insufficient to effectively counteract the temperature variation.

Now if the decoupling resistor is replaced by a thermistor 25 having a negative temperature coefficient, additional temperature stabilization will be provided which is sufficient to maintain the output current and overall gain substantially constant over a predetermined temperature range. With increase in temperature, the resistance of thermistor 25 goes down, producing a higher potential at junction 16. From the $I_c$–$V_c$ characteristics of typical transistors, it is known that the collector current of transistor 1 flowing through load resistor 7 will change very little with change in collector voltage. Therefore, with increase in potential at point 16, the base to emitter voltage of transistor 2 will increase, resulting in an increased current through resistor 11. This increase in current through resistor 11 lowers the potential of collector 9 of transistor 2 by more than the increase due to the lowering of the resistance 25. This is because the effect of the increase of base to emitter voltage of transistor 2 is amplified by the gain of stage 2. The net effect is that the base to emitter bias of transistor 3 is reduced, counteracting the tendency of the output current to increase with rise in temperature that would normally result if resistor 25 were not temperature dependent in the manner specified.

By virtue of the above-described compensation technique, the voltage at the collector 9 of transistor 2 is maintained substantially constant despite fairly wide variations in temperature. This provides a substantially constant base-emitter bias voltage for transistor 3, thereby stabilizing the D.C. current flowing in the load device 15. This condition is an important factor in obtaining satisfactory life of the small battery cell 20. It is to be further noted that the value of multi-function temperature compensative resistance 25 should be selected in conjunction with the desired load, thereby permitting effective temperature stabilization over a wide range of output loads, e.g., 100 to 5000 ohms impedance.

A typical set of component values for the circuit when used as a hearing aid audio amplifier which is temperature stabilized over a range of temperatures from 20° to 120° F. is as follows. It should be understood, however, that these are given for illustrative purposes only, and are in no way intended to limit the scope of my invention.

Resistors:
- 7—3.9 KΩ
- 11—3.9 KΩ.
- 7—3.9 KΩ.
- 22—300 KΩ to 800 K.
- 21—5 KΩ (variable).

Thermistor 25—1 K$\theta$ 25° C.

Capacitors:
- 27—0.02 mfd.
- 23—1.0 mfd.
- 26—5.0 mfd.

Microphone 12—z=5 KΩ @ 1 khz. (magnetic type).

Earphone 15:
- z=1 KΩ @ 1 khz. (magnetic type.)
- $R_{DC}$=300 Ω.

$\beta$ of transistors 1, 2 and 3—approx. 50

It is further pointed out that the overall gain of the amplifier may be changed by changing the nominal value of thermistor 25. This change in thermistor value changes the operating points of the transistors (in the absence of a temperature change), which in turn changes the gain of the amplifier. Note that the value of capacitor 26 will also have to be changed accordingly to provide proper decoupling.

The amplifier according to this invention has yet another very important advantage. In many applications, such as in hearing aids, it is of great value to be able to either encapsulate the circuit in a miniaturized form or to manufacture it by integrated circuit techniques. In such a case, it is of great practical importance to have as few external connections to the amplifier as possible. The amplifier of FIG. 1 is especially suitable for the above types of construction. For example, using integrated circuit techniques the shaded portion 30 of the circuit may be produced on a single semiconductor chip and only four terminals 16, 17, 18 and 19 are required for making external connections. If previous temperature stabilization techniques were used instead of the inventive technique, i.e., if a thermistor is coupled to the base of transistor 3, then at least one extra terminal would have to be provided for coupling the thermistor to the circuitry. This would needlessly increase the production costs of fabricating such an amplifier.

Figure 2:
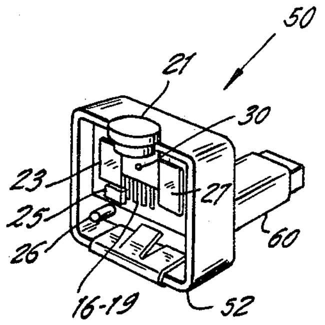
FIGURE 2 is a simplified perspective view of an in-the-ear hearing aid device, utilizing a temperature stabilized circuit, in accordance with the instant invention, and showing only certain of the components thereof, which form portions of my novel combined decoupling and temperature stabilized circuit.
Figure 5:
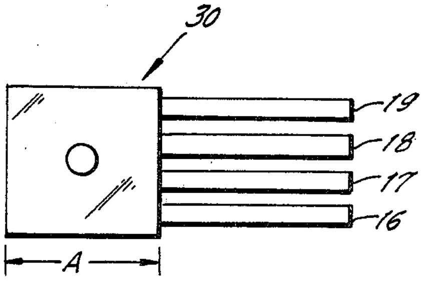
FIGURES 5 and 6 are elevation and front views respectively of the integrated circuit portion of my novel amplifier.
Figure 6:
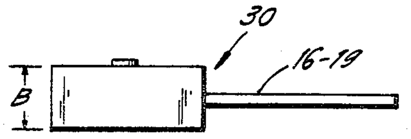
Figures 3, 4:
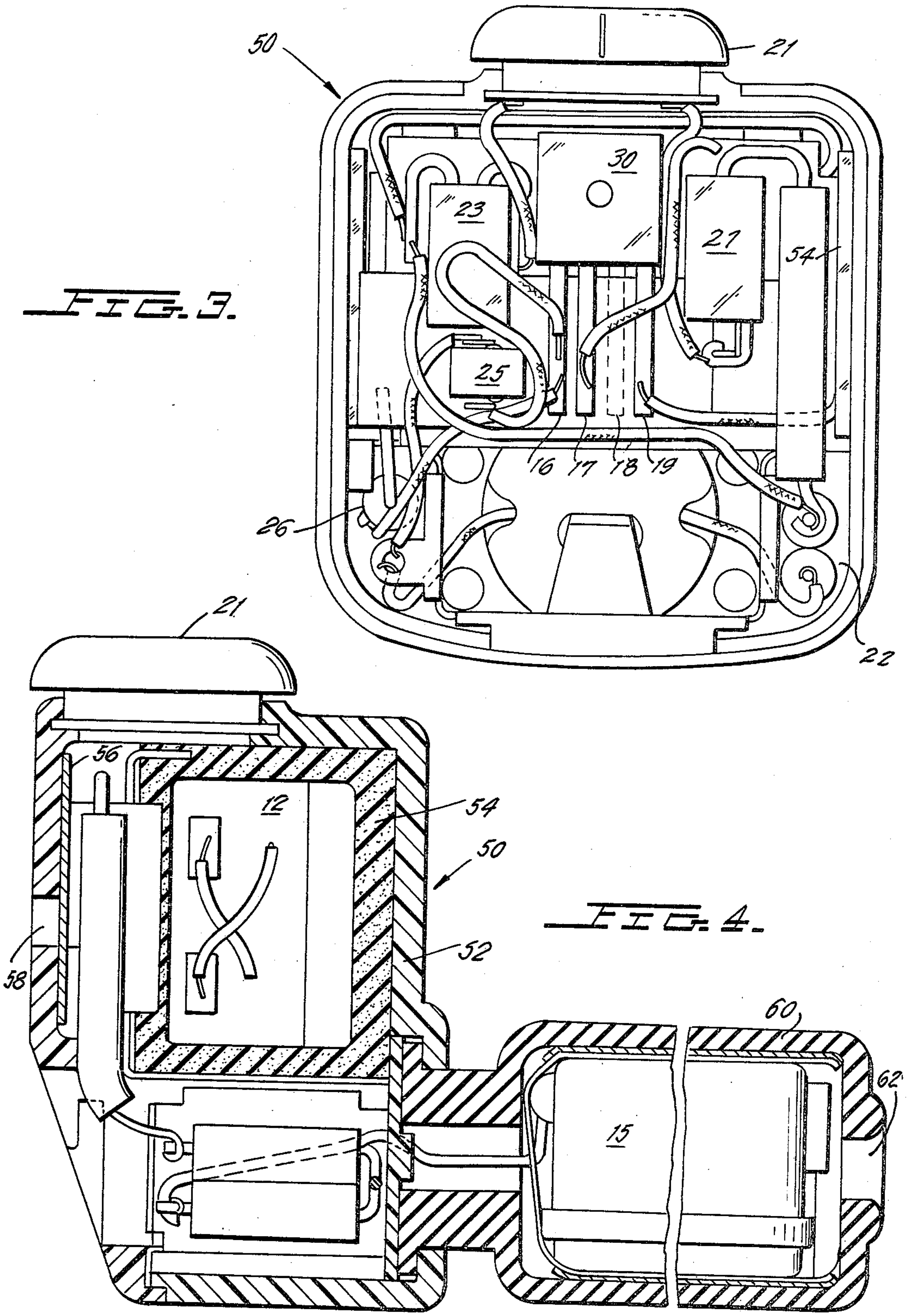
FIGURE 3 is a front elevational view of the entire hearing aid unit of FIGURE 2, shown assembled, with the front portion of the housing and the battery removed.
FIGURE 4 is a side cross-sectional view of the hearing aid device of FIGURE 2.

The physical configuration of the assembled hearing aid device utilizing the instant circuit is shown in FIGS. 2–4, with FIGS. 5 and 6 denoting the integrated circuit portion 30. Integrated circuit 30 is extremely compact, with the dimensions A and B being typically 0.110 and 0.044 inch. The hearing aid components are contained within a housing, including a main body portion 52 and a depending body portion 60, which contains the earphone 15. As is well known, portion 60 is of a convenient size to fit within the user's ear canal, and includes sound outlet 62 for presenting the amplified audio signals to the user. Microphone 12 is acoustically suspended by the material generally shown as 54, and includes a sound inlet adjacent grill 56, which in turn covers sound inlet aperture 58 of the hearing aid housing. Volume control 21 includes a rotatable knob projecting outward of the hearing aid housing to permit a manual adjustment of instrument gain.

It should be recognized that the various components are compactly assembled within the hearing aid housing, with negative temperature coefficient elements 25 being positioned so as to readily permit connection to one of the externally accessible output terminals 16 of the integrated circuit.

It should naturally be understood that the above-described hearing aid device is typical of the types of instruments which may utilize my novel amplifier circuit, and is principally shown for illustrative purposes.

While I have described above, the principles of my invention with reference to specific apparatus, it is to be clearly understood that this description is made only by way of example and not as a limitation to the scope of my invention as set forth in the accompanying claims.

The embodiments of the invention in which an exclusive privilege or property is claimed are defined as follows:

1. In a multistage direct current coupled amplifier circuit for the amplification of audio signals;
   at least a first and second amplifying element;
   a unidirectional bias source;
   biasing means connected between said amplifying elements and said unidirectional source for biasing said amplifying elements to establish predetermined D.C. operating points;
   said amplifying elements each including input and output terminal means, with the output terminal means of said first amplifying element direct current coupled to the input terminal means of said second amplifying element;
   input signal means for presenting an audio signal to be amplified to the input terminal means of said first amplifying element;
   output signal means for receiving the amplified input signal from the output terminal means of said second amplifying element;
   a decoupling circuit interconnected between said unidirectional source and said amplifying elements for decoupling said amplifying elements from feedback signals due to the internal impedance of said unidirectional source;
   said amplifying elements characterized as having a gain and current dependent on temperature;
   and said decoupling circuit including a negative temperature coefficient element circuit-connected between said amplifying elements and said unidirectional source in a manner which counteracts said temperature induced variation of gain and current, such that said negative temperature-coefficient element of the decoupling circuit provides temperature stabilization over a predetermined ambient operating range.

2. In a multistage direct current coupled amplifier circuit as set forth in claim 1,
   said first and second amplifying elements being transistors having collector, emitter and base terminals.

3. In a multistage direct current coupled amplifier circuit as set forth in claim 2,
   said decoupling and temperature stabilizing circuit consisting solely of said negative temperature coefficient element and a capacitor.

4. In a multistage direct current coupled amplifier circuit as set forth in claim 2,
   the output of said first transistor being direct coupled to the input of said second transistor.

5. In a multistage direct current coupled amplifier circuit as set forth in claim 4, further including:
   first and second load resistors connected between the collector terminals of said first and second transistors, respectively, and a common junction;
   said negative temperature coefficient element being a resistor;
   said negative temperature coefficient resistor connected between said common junction and said unidirectional source;
   the voltage drop across said first load resistor circuit-connected to said second transistor such that a temperature induced increase of said first transistor collector current tends to reduce the base-to-emitter bias of said second transistor, thereby tending to reduce the collector current and increase the collector potential of said second transistor;
   said negative temperature coefficient resistor experiencing a simultaneous decrease in resistance to compensatingly increase the base-to-emitter bias of said second transistor, such that the combined temperature characteristics of said first transistor and said negative temperature coefficient resistor maintain the collector potential of said second transistor substantially constant.

6. A temperature stabilized audio amplifier, including:
at least a first and second transistor, each including collector, emitter and base terminals;
a unidirectional bias source and bias circuit means to establish predetermined D.C. operating points of said transistors;
a decoupling circuit interconnected between said unidirectional source and said transistors for decoupling said transistors from feedback signals occurring due to the internal impedance of said unidirectional source;
a first load resistor connected between the collector terminal of said first transistor and a common junction;
a second load resistor connected between the collector terminal of said second transistor and said common junction;
said decoupling circuit consisting solely of a negative temperature coefficient resistor and a capacitor, with said negative temperature coefficient resistor connected between said common junction and one of the terminals of said unidirectional source;
a direct current coupled connection between the collector of said first transistor and the base of said second transistor;
the emitter terminals of said first and second transistors connected to the opposite terminal of said unidirectional source;
input signal means for presenting audio signals to be amplified to the base of said first transistor;
output signal means connected to the collector of said second transistor for receiving the amplified audio signal;
said transistors characterized as having a gain and current dependent on temperature such that the collector current of said first transistor tends to increase with temperature;
said increasing collector current increasing the voltage drop across said first load resistor so as to decrease the base-to-emitter bias of said second transistor, thereby tending to reduce the collector current and increase the collector potential of said second transistor;
said negative temperature coefficient resistor experiencing a simultaneous decrease in resistance to compensatingly increase the base-to-emitter bias of said second transistor such that the combined temperature characteristics of said first transistor and said negative temperature coefficient resistor maintain the collector potential of said second transistor substantially constant.

7. A hearing aid device comprising:
a microphone for receiving audio signals to be amplified,
a multistage direct current coupled amplifier circuit having an input circuit connected to said microphone and an output circuit connected to an earphone,
said earphone adapted to present amplified audio signals to the ear of a user,
said multistage amplifier circuit including:
at least a first and second amplifying element;
a unidirectional bias source;
biasing means connected between said amplifying elements and said unidirectional source for biasing said amplifying elements to establish predetermined D.C. operating points;
said amplifying elements each including input and output terminal means, with the output terminal means of said first amplifying element direct current coupled to the input terminal means of said second amplifying element, and with the input terminal means from said first amplifying element coupled to said microphone;
output signal means for receiving the amplified input signal from the output terminal means of said second amplifying element;
a decoupling circuit interconnected between said unidirectional source and said amplifying elements for decoupling said amplifying elements from feedback signals due to the internal impedance of said unidirectional source;
said amplifying elements characterized as having a gain and current dependent on temperature;
and said decoupling circuit including a negative temperature coefficient element circuit-connected between said amplifying elements and said unidirectional source in a manner which counteracts said temperature induced variation of gain and current, such that said negative temperature-coefficient element of the decoupling circuit provides temperature stabilization over a predetermined ambient operating range, whereby said decoupling circuit also serves as a temperature stabilizing circuit;
said amplifying elements being contained within an integrated circuit having a plurality of output terminals;
said negative temperature coefficient element being external to said integrated circuit and connected to one of its output terminals.

8. A hearing aid device comprising:
a microphone for receiving audio signals to be amplified;
a multistage direct current coupled amplifier circuit, having an input circuit connected to said microphone and an output circuit connected to an earphone;
said earphone adapted to present amplified audio signals to the ear of a user;
said multistage amplifier circuit including:
at least a first and second transistor, each including collector, emitter and base terminals;
a unidirectional bias source and bias circuit means to establish predetermined D.C. operating points of said transistors;
a decoupling circuit interconnected between said unidirectional source and said transistors for decoupling said transistors from feedback signals occurring due to the internal impedance of said unidirectional source;
a first load resistor connected between the collector terminal of said first transistor and a common junction;
a second load resistor connected between the collector terminal of said second transistor and said common junction;
said decoupling circuit consisting solely of a negative temperature coefficient resistor and a capacitor, with said negative temperature coefficient resistor connected in series between said common junction and one of the terminals of said unidirectional source;
a direct current coupled connection between the collector of said first transistor and the base of said second transistor;
the emitter terminals of said first and second transistors connected to the opposite terminal of said unidirectional source;
said microphone presenting the audio signals to be amplified to the base of said first transistor;
said earphone connected to the collector of said second transistor for receiving the amplified audio signal;
said transistors characterized as having a gain and current dependent on temperature such that the collector current of said first transistor tends to increase with temperature;
said increasing collector current increasing the voltage drop across said first load resistor so as to decrease the base-to-emitter bias of said second transistor, thereby tending to reduce the collector current and increase the collector potential of said second transistor;

said negative temperature coefficient resistor experiencing a simultaneous decrease in resistance to compensatingly increase the base to emitter bias of said second transistor such that the combined temperature characteristics of said first transistor and said negative temperature coefficient resistor maintain the collector potential of said second transistor substantially constant;

said first transistor, second transistor, first load resistor and second load resistor being contained within an integrated circuit having a plurality of output terminals, including said common junction;

said negative temperature coefficient resistor being external to said integrated circuit.

9. In a hearing aid device as set forth in claim 8, the value of said negative temperature coefficient resistor selectable in conjunction with the desired amplifier output load to provide effective temperature stabilization over output loads within the range of at least 100 to 5,000 ohms impedance.

References Cited

UNITED STATES PATENTS

| | | | |
|---|---|---|---|
| 2,915,600 | 12/1959 | Starke | 330—25 |
| 2,975,260 | 3/1961 | Carlson | 330—25 |
| 3,373,368 | 3/1968 | Gewirtz | 330—25 |
| 3,197,576 | 7/1965 | Martin. | |
| 3,209,083 | 9/1965 | Posen. | |
| 3,243,511 | 3/1966 | Erdman et al. | |
| 3,317,671 | 5/1967 | Mitchell et al. | |
| 3,320,365 | 5/1967 | Auernheimer. | |
| 3,382,321 | 5/1968 | Lybarger et al. | |

KATHLEEN H. CLAFFY, Primary Examiner

A. A. McGILL, Assistant Examiner

U.S. Cl. X.R.

179—107; 330—25